United States Patent
Chen et al.

(10) Patent No.: US 8,911,551 B2
(45) Date of Patent: Dec. 16, 2014

(54) ELECTROLESS PLATING APPARATUS AND METHOD

(75) Inventors: Jason Chen, Tao Yuan Shien (TW);
Nakano Liu, Tao Yuan Shien (TW);
Winson Shao, Tao Yuan Shien (TW);
Wen Chu, Tao Yuan Shien (TW);
Chang-Hwang Hua, Tao Yuan Shien (TW)

(73) Assignee: Win Semiconductor Corp., Tao Yuan Shien (TW)

( * ) Notice: Subject to any disclaimer, the term of this patent is extended or adjusted under 35 U.S.C. 154(b) by 130 days.

(21) Appl. No.: 13/196,179

(22) Filed: Aug. 2, 2011

(65) Prior Publication Data

US 2013/0034959 A1 Feb. 7, 2013

(51) Int. Cl.
*B05C 11/00* (2006.01)
*C23C 18/16* (2006.01)
*H01L 21/768* (2006.01)
*H01L 21/288* (2006.01)

(52) U.S. Cl.
CPC .......... *H01L 21/288* (2013.01); *C23C 18/1619* (2013.01); *H01L 21/76843* (2013.01); *C23C 18/1666* (2013.01); *C23C 18/1669* (2013.01)
USPC ............................ 118/600; 118/612; 438/678

(58) Field of Classification Search
CPC .............. C25D 5/20; C25D 5/22; C25D 5/08; C25D 21/10; C25D 5/026; C25D 5/10
USPC .................................. 438/678; 118/600, 612
See application file for complete search history.

(56) References Cited

U.S. PATENT DOCUMENTS

| | | | | |
|---|---|---|---|---|
| 4,482,445 A | * | 11/1984 | Fjelstad | 205/646 |
| 5,516,412 A | * | 5/1996 | Andricacos et al. | 204/224 R |
| 5,830,805 A | * | 11/1998 | Shacham-Diamand et al. | 438/678 |
| 6,261,433 B1 | * | 7/2001 | Landau | 205/96 |
| 2005/0145482 A1 | * | 7/2005 | Suzuki et al. | 204/199 |
| 2007/0181441 A1 | * | 8/2007 | Kovarsky et al. | 205/646 |

* cited by examiner

*Primary Examiner* — Khiem D Nguyen
(74) *Attorney, Agent, or Firm* — Muncy, Geissler, Olds & Lowe, P.C.

(57) ABSTRACT

An electroless plating apparatus and method designed specifically for plating at least one semiconductor wafer are disclosed. The apparatus comprises a container, a wafer holder, an electrolyte supplying unit, and an ultrasonic-vibration unit. The container is provided with at least an inlet and used for containing electrolyte. The wafer holder is provided within the container. The electrolyte supplying unit is used to supply the electrolyte into the container via the inlet. The ultrasonic-vibration unit consisting of at least one frequency ultrasonic transducer is disposed in the container for producing a uniform flow of electrolyte in the container. Thereby, the wafers can be uniformly plated, especially for wafers with fine via-holes or trench structures.

4 Claims, 17 Drawing Sheets

ELECTROLESS PLATING APPARATUS AND METHOD

TECHNICAL FIELD

The present invention relates to an electroless plating apparatus and method, and more particularly, to an electroless plating apparatus and method for semiconductor wafers, by which the electrolyte can distribute uniformly and flow evenly around each wafer, and thereby the wafers can be uniformly plated, especially for wafers with fine via holes or trenches when an ultrasonic shaking bath is used.

BACKGROUND

Electroless plating technique has been a well-developed plating technology. Currently, this technique is used mostly for treating objects other than semiconductor wafers. Accordingly, no strict demand is required regarding the uniformity of the thickness of plated film. Besides, this technique is also not designed specifically for plating micro-size via holes.

Recently, with the rapid development of semiconductor technology, the electroless plating technique becomes very popular for plating metal film on semiconductor wafers, such as those of plating a Au or Cu metal film on backside via holes of silicon chips or gallium arsenide chips.

Therefore, there is an increasing demand for the thickness uniformity of the plated film and the capability of plating of micro-size via holes or trenches. However, conventional electroless plating techniques cannot meet the aforementioned requirements for plating semiconductor wafers.

In order to meet the demands for semiconductor technology, the conventional electroless plating technique should be improved. One possible way is to develop a novel formula for the electrolyte. The other way is to modify the apparatus used for electroless plating. The present invention is aimed to modify current electroless plating apparatus in order to make the plating of wafers optimum.

SUMMARY OF THE DISCLOSURE

An object of the present invention is to provide an electroless plating apparatus and method for semiconductor wafers, by which the electrolyte can distribute uniformly and flow evenly around each wafer, and thereby the wafers can be uniformly plated.

Another object of the present invention is to provide an electroless plating apparatus and method, which is capable of producing ultrasonic vibration and thereby improving the capability of plating wafers with micro-size via holes or trenches.

In order to achieve above objects, the present invention provides an electroless plating apparatus, which can be used for plating at least one wafer, comprising a container, a wafer holder, an electrolyte supplying unit, and an ultrasonic-vibration unit. The container consisting of at least one inlet is used for containing the electrolyte for plating. The wafer holder is provided within the container, and it is used for holding at least one wafer, so as to fully immerse the at least one wafer vertically in the electrolyte. The electrolyte supplying unit is used for supplying the electrolyte into the container via the inlet. The ultrasonic-vibration unit consisting of at least one frequency ultrasonic transducer is disposed in the container and is used for producing a uniform flow of electrolyte in the container.

In another embodiment, the present invention provides an electroless plating apparatus comprising a container, a wafer holder, and an electrolyte supplying unit. The container is used for containing the electrolyte and is provided with a plurality of inlets. Through the multiple inlets, the electrolyte can flow into the container with multiple streams. The wafer holder is provided within the container, and it is used for holding at least one wafer, so as to fully immerse the at least one wafer vertically in the electrolyte. The electrolyte supplying unit is used for supplying the electrolyte into the container via the inlets.

In another embodiment, the present invention provides an electroless plating method comprising following steps: providing a container having at least one inlet; providing a wafer holder in the container for positioning at least one wafer; providing an electrolyte supplying unit for supplying electrolyte into the container via the at least one inlet; and providing an ultrasonic-vibration unit consisting of at least one frequency ultrasonic transducer, which is disposed in the container and is used for producing a uniform flow of electrolyte in the container.

The following detailed description, given by way of examples or embodiments, will best be understood in conjunction with the accompanying drawings.

DETAILED DESCRIPTION

The present invention discloses an electroless plating apparatus used for electroless plating of at least one wafer. The electroless plating apparatus comprises a container, a wafer holder, and an electrolyte supplying unit. The container is provided with at least one inlet and is used for containing the electrolyte. The wafer holder is immersed in the electrolyte within the container. The electrolyte supplying unit is used for supplying the electrolyte into the container via the at least one inlet.

The present invention has four critical features including: (1) the control of flow field of electrolyte; (2) the improvement of the wafer holder structure; (3) the application of ultrasonic vibration; and (4) the shaking of the wafer holder. The electroless plating apparatus of the present invention can adopt any one of above four features or adopt any combination including at least two of them. Each of the features is to be illustrated in details as follows.

Figure 1:
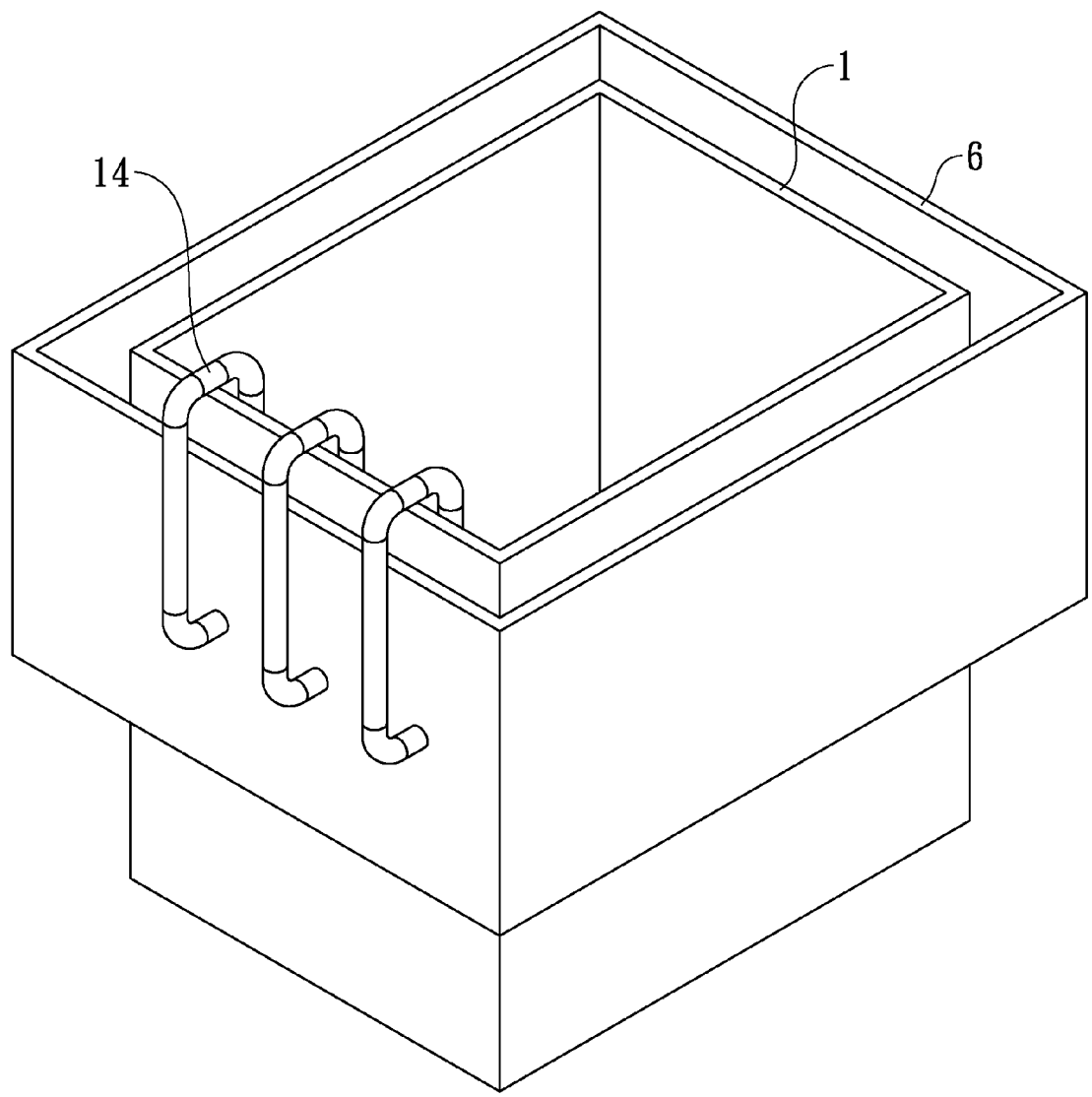
FIG. 1 is a perspective view of a container of the electroless plating apparatus of the present invention.
Figure 1A:
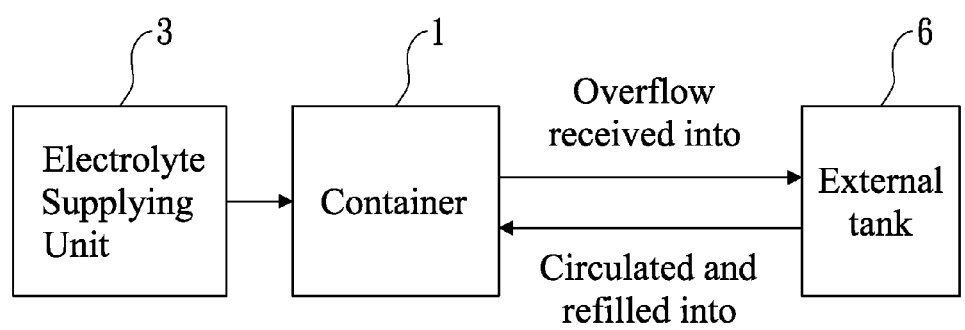
FIG. 1A is a schematic view showing the supply and circulation of electrolyte in the electroless plating apparatus of the present invention.

Regarding the Flow-Field Control:

Please refer to FIGS. 1 and 1A showing an embodiment for the control of the supply and the circulation of the electrolyte. As shown in these figures of the present embodiment, in addition to the container 1 and the electrolyte supplying unit 3, the electroless plating apparatus also comprises a circulation unit, and the circulation unit further includes an external tank 6.

As shown in FIG. 1A, the electrolyte is first supplied from the electrolyte supplying unit 3 to the container 1, and then the supplied electrolyte can be reused by means of circulation. Besides, the circulation unit in this embodiment is also used to keep the electrolyte flowing.

The external tank 6 of the circulation unit is used to receive the electrolyte that overflows out of the container 1 and then to refill the electrolyte into the container 1 via conduits 14.

What disclosed above is only one embodiment to fulfill the object of circulating the electrolyte. Alternatively, the electrolyte can also be first supplied by the electrolyte supplying unit into the external tank 6 and then feeds into the container 1 via the conduits 14. In other words, any structure aimed for circulating the electrolyte can be adopted without departing from the spirit of the present invention.

As mentioned above, it is necessary to keep the electrolyte flowing during the electroless plating process. The control of the electrolyte flow field is one of the main feature of the present invention.

With the increasing numbers of inlets of the container 1, the flow fields of the electrolyte also changes accordingly. When the container 1 is provided with one inlet, only one stream will be generated therein. In this case, an object (such as a wafer) to be plated in the container 1 may fail to produce a plated film with an uniform thickness or even fail to plate the object completely. For example, if the flow field of the electrolyte is confined to the central region of the object to be plated, a thinner film will be plated around the edges of the object.

Figure 3:
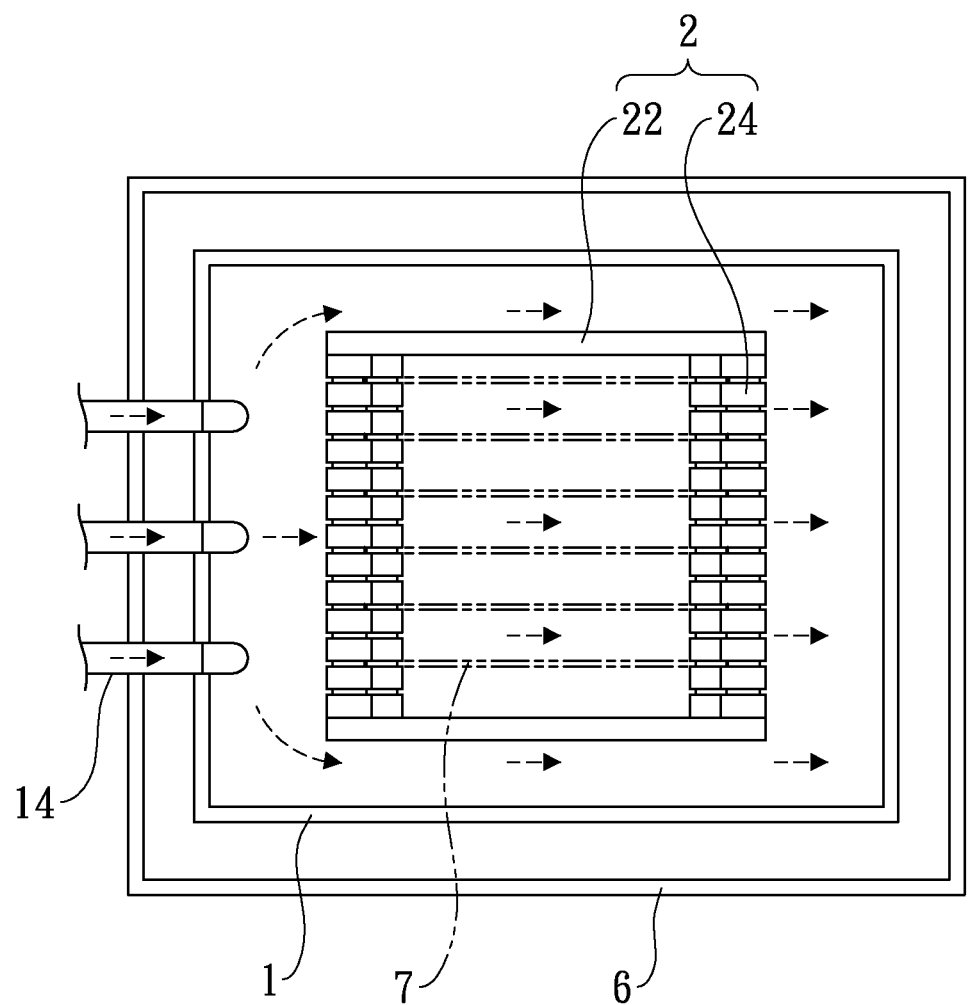
FIG. 3 shows a top view of the electroless plating apparatus of the present invention, where the wafer holder and the container are assembled.

By providing the container 1 with a plurality of inlets 12, it is possible to produce multiple streams of the inflow electrolyte. As shown in FIG. 3, the produced multiple streams are evenly distributed in the container 1 and can form more uniform flow field, so that a film with a uniform thickness can be plated onto the object.

Figure 7:
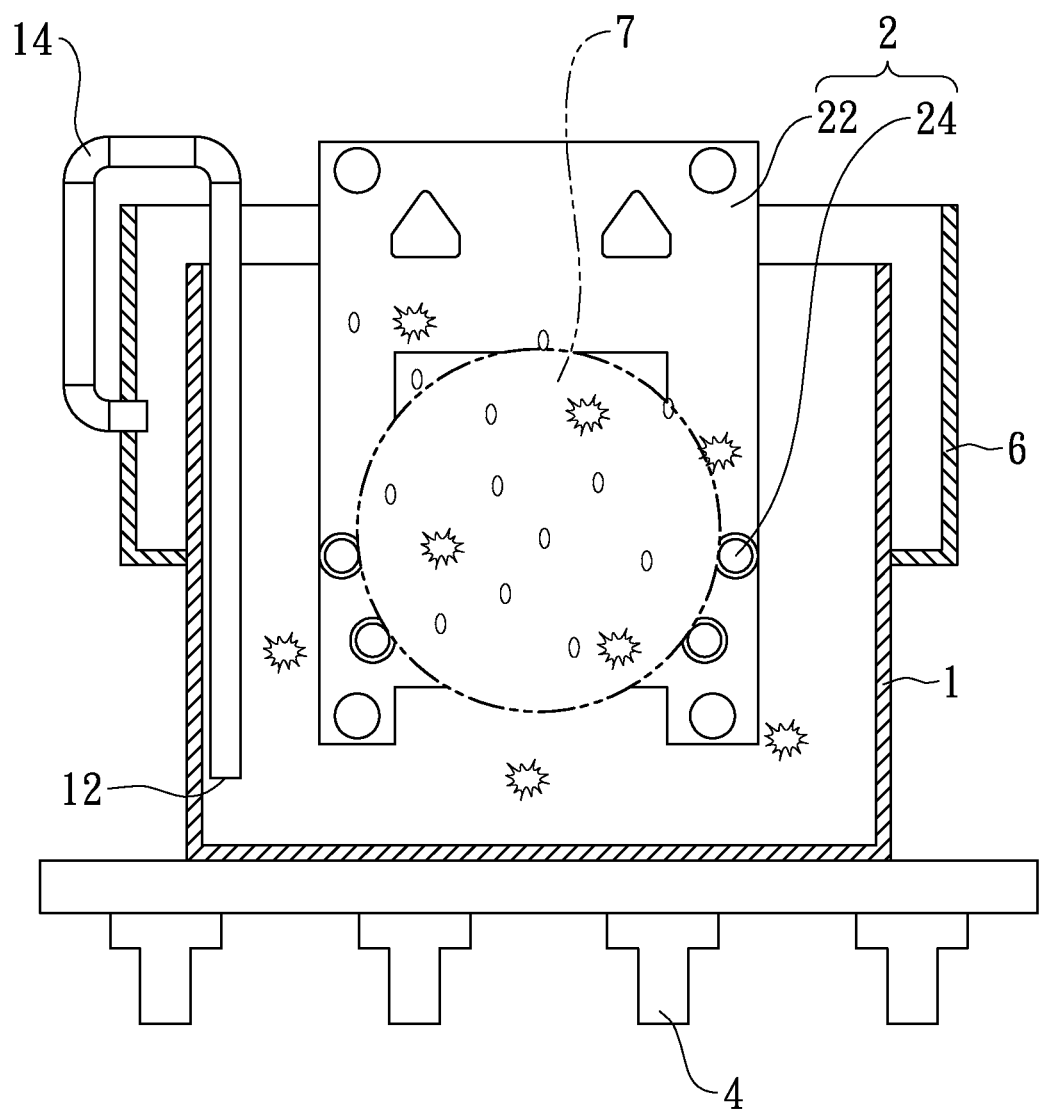
FIG. 7 shows a cross-sectional lateral view of the electroless plating apparatus of the present invention, where the wafer holder, the container, and an ultrasonic-vibration unit are assembled.

Regarding the Application of Ultrasonic Vibration:

Please refer to FIG. 7, which shows the use of an ultrasonic-vibration unit in the electroless plating apparatus of the present invention. In implementation, the ultrasonic-vibration unit consisting of a plurality of frequency ultrasonic transducers is disposed in the container 1. Thereby, the electrolyte in the container 1 can be agitated uniformly so as to keep a uniform flow of electrolyte through the wafers.

In addition to the abovementioned benefit, the use of the ultrasonic vibration unit also facilitates the plating of wafers with via-holes or trenches structures. Indeed, the plating of micro-sized via-holes is not straightforward since the electrolyte can flow into the via-holes only by means of diffusion. Moreover, the air bubbles that normally exist in the via-hole structures will further hinder the plating of the inner sidewalls and the bottom surface of the via-hole structures.

In order to overcome the above-mentioned shortcoming, ultrasonic technique is adopted. The ultrasonic vibration can produce a large number of tiny ultrasonic bubbles, which can flow into the via-hole structure and thereby driving the air bubbles away from the via-holes. Moreover, as for the use of ultrasonic vibration, the frequency or the mode of vibration can be altered as required. For example, different frequencies or different vibration modes can be used, such as a single and continuous vibration mode or an intermittence-type vibration.

Figure 2:
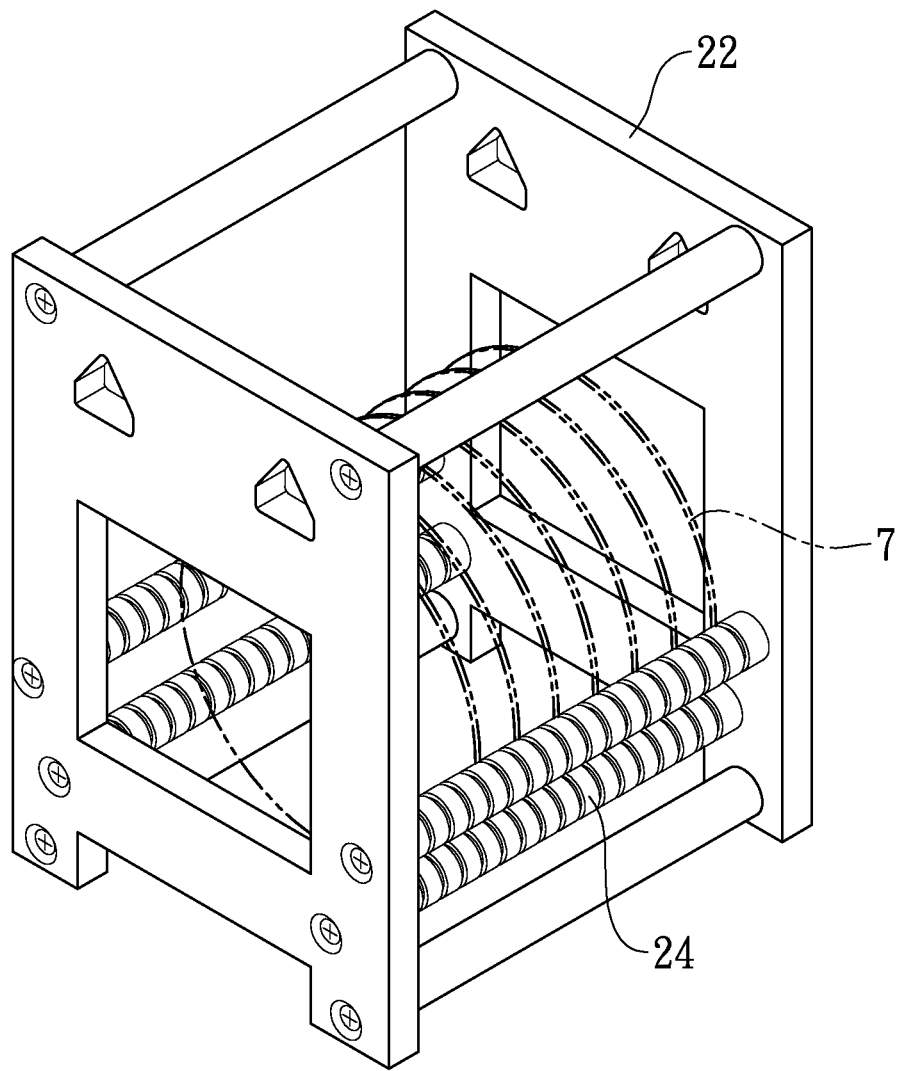
FIG. 2 is a perspective view of a wafer holder of the electroless plating apparatus of the present invention.

Regarding the Improvement of the Wafer Holder Structure:

Please refer to FIG. 2 showing the wafer holder in the electroless plating apparatus according to the present invention. As shown in this figure, the wafer holder 2 comprises a frame 22 and at least one pair of clamps 24. The feature of the frame 22 is its hollow structure. Besides, each pair of clamps 24 is disposed at the two sides of the frame 22 in order to hold at least one wafer.

Figure 4:
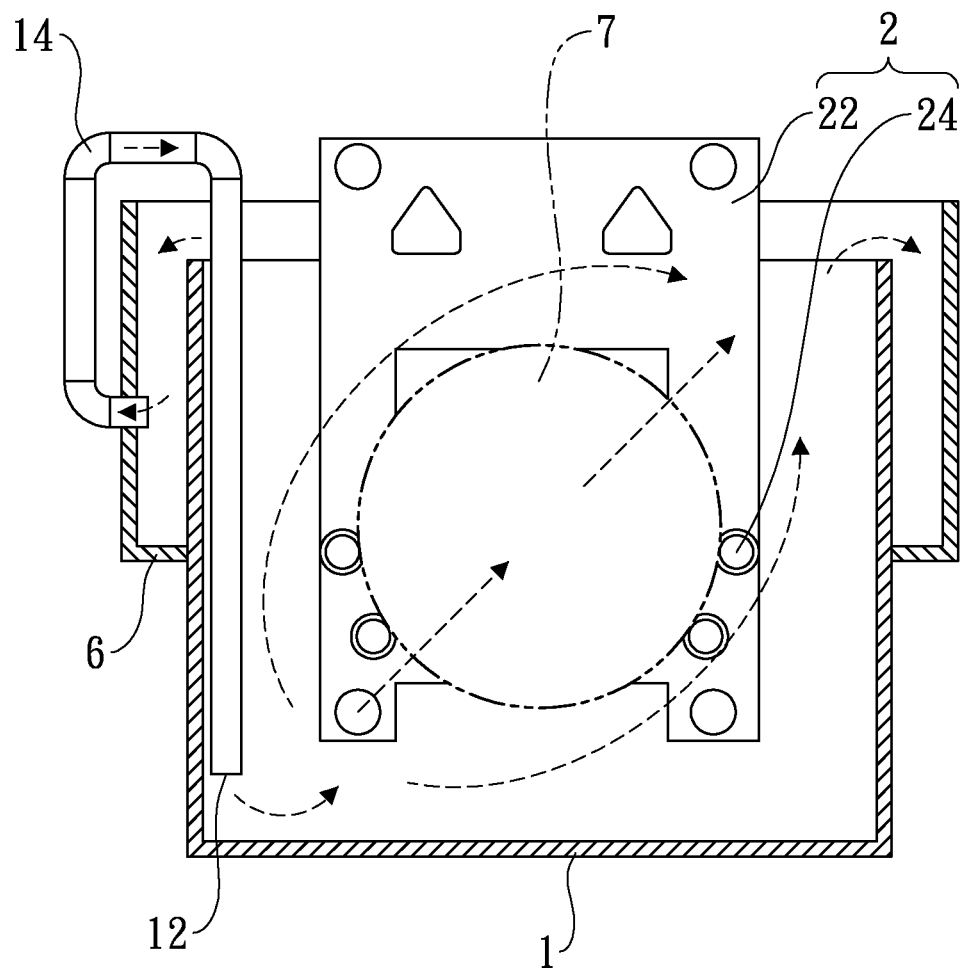
FIG. 4 shows a cross-sectional view of FIG. 3.

As shown in FIGS. 3 and 4, when the wafer holder holding plural wafers is placed into the container 1, the electrolyte in the container 1 can flow freely through the frame 22 because of its hollow structure.

Moreover, the hollow structure of the frame 22 also facilitates the application of ultrasonic vibration, by which the agitated electrolyte can flow evenly through the hollow frame 22 and hence the wafers held therein without obstacles.

Regarding the Use of the Shaking Unit:

As shown in FIG. 2, the wafers are clamped vertically in the wafer holder 2. Therefore, it is difficult to keep a constant speed of flow during the electrolyte passing through different parts of the wafers. Moreover, the gas bubbles formed during electroless plating are usually sticking on the surfaces of the wafers. As a result the thickness of the plated film on the wafers is usually non-uniform.

In order to tackle this difficulty, a shaking unit is further included in the electroless plating apparatus of the present invention. The shaking unit is attached to the wafer holder and is used for shaking the wafer holder vertically.

Figure 5:
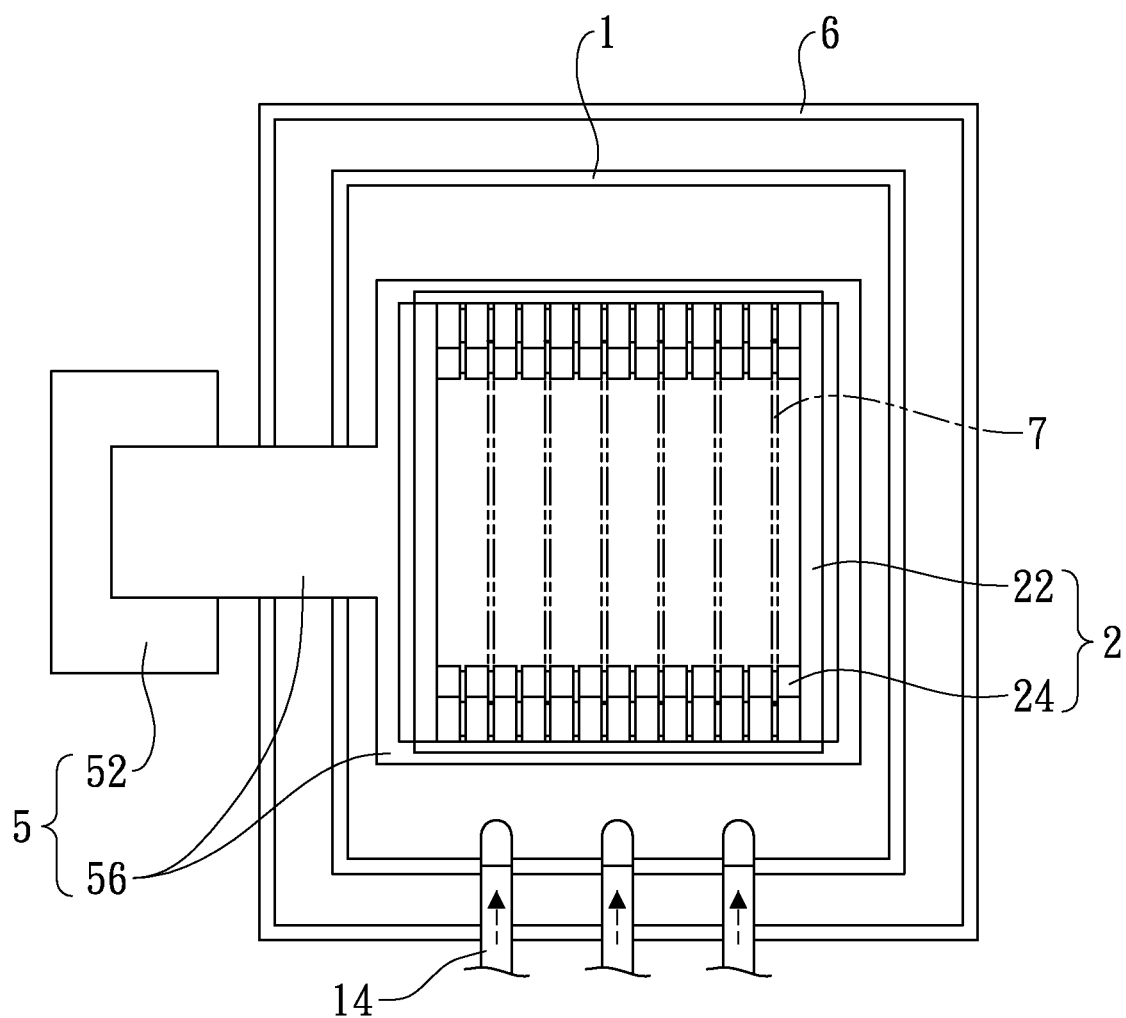
FIG. 5 shows a top view of the electroless plating apparatus of the present invention, where the wafer holder, a shaking unit, and the container are assembled.
Figure 6:
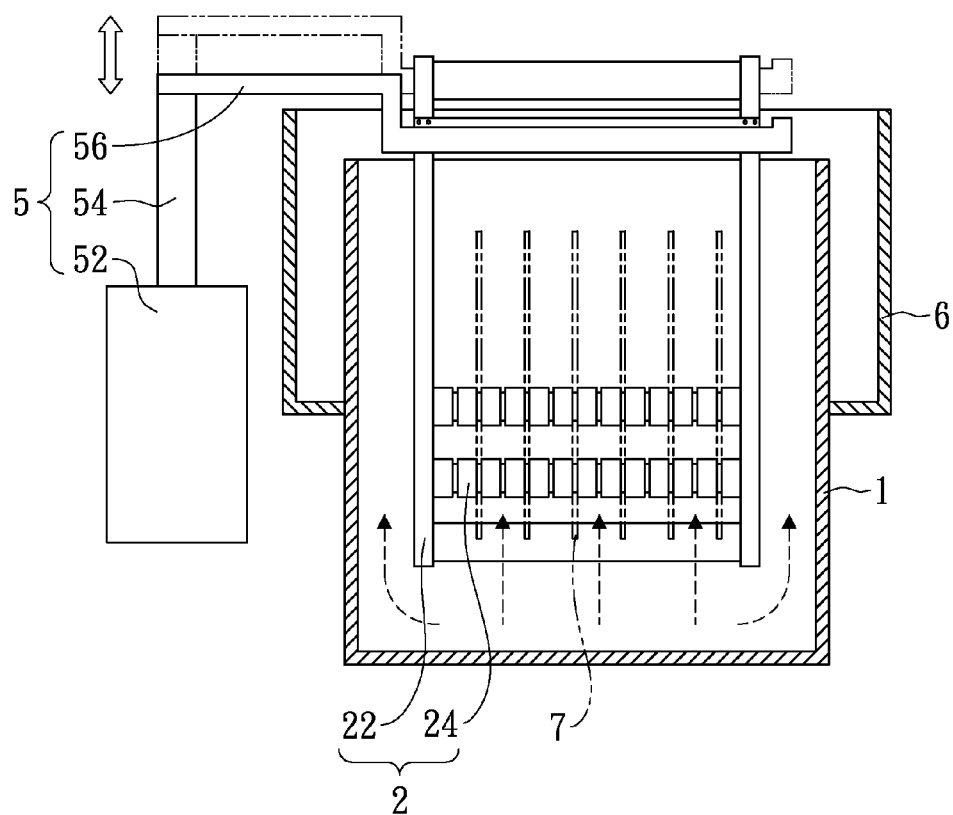
FIG. 6 shows a cross-sectional view of FIG. 5.

Please refer to FIGS. 5 and 6, where an embodiment of the shaking unit is illustrated. As shown in these figures, the shaking unit 5 comprises a driving device 52, a linking element 54, and a first connecting element 56. The driving device 52 (such as a motor) is connected to the linking element 54, so as to move the linking element 54 vertically. One side of the first connecting element 56 is connected to the linking element 54 while another side thereof is connected to an upper part of the frame 22 of the wafer holder 2.

In this way, when the driving device 56 is turned on, the mechanical motion can be transferred to the first connecting element 56 via the linking element 54, and thereby, driving the wafer holder 2 to shake vertically. This vertical movement, in turn, makes the electrolyte flow passing evenly through different parts of the wafers. Moreover, the vertical movement of the first connecting element 56 also agitates the electrolyte in the container 1, so as to make the concentration distribution of the electrolyte more uniform.

Figure 8:
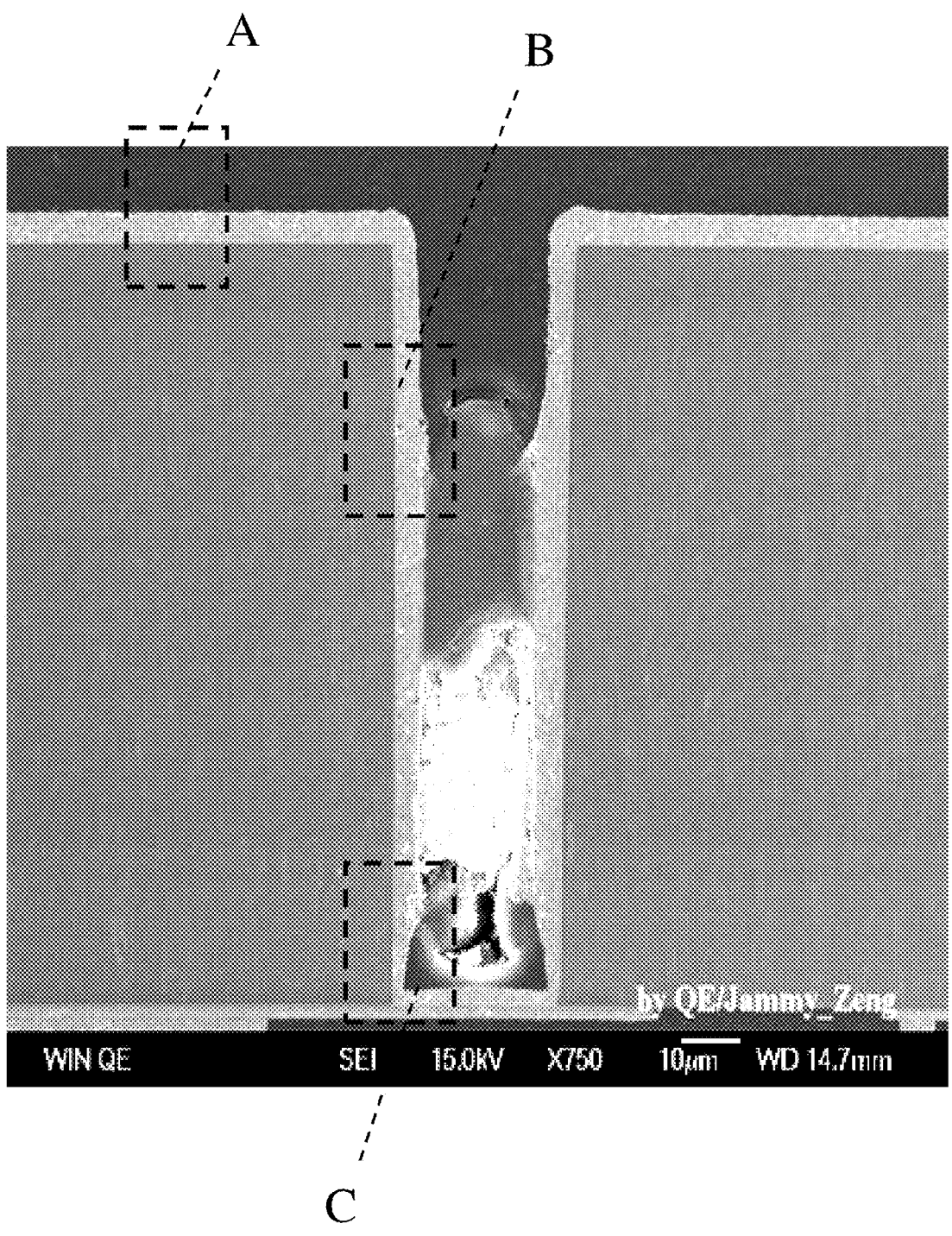
FIG. 8 shows a scanning electron microscopic image of a wafer after electroless plating process, in which a single frequency ultrasonic transducer is used for generating a low frequency vibration and a single stream produced by a single inlet.
Figure 8A:
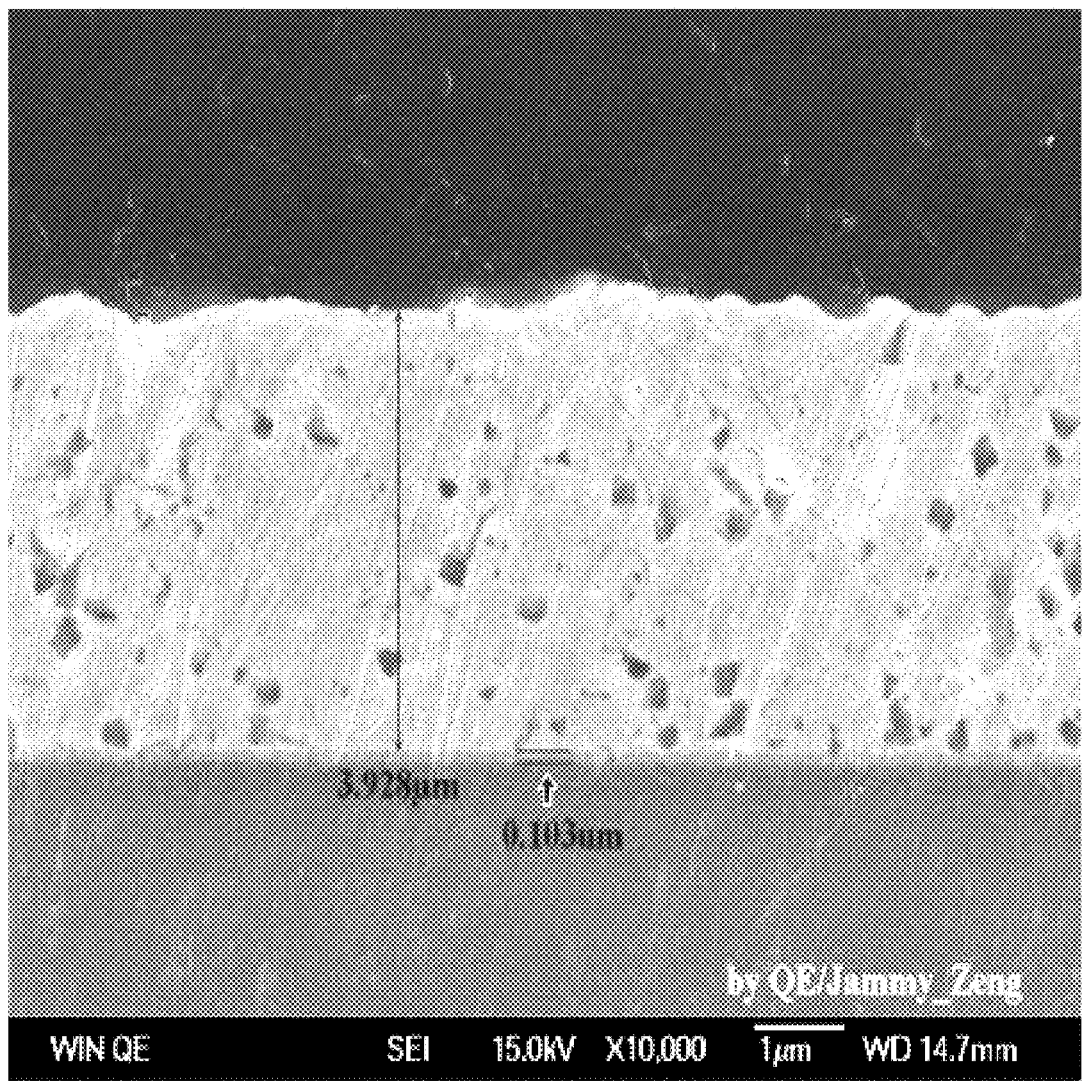
FIGS. 8A-8C show the enlarged areas A, B, and C in FIG. 8.
Figure 8B:
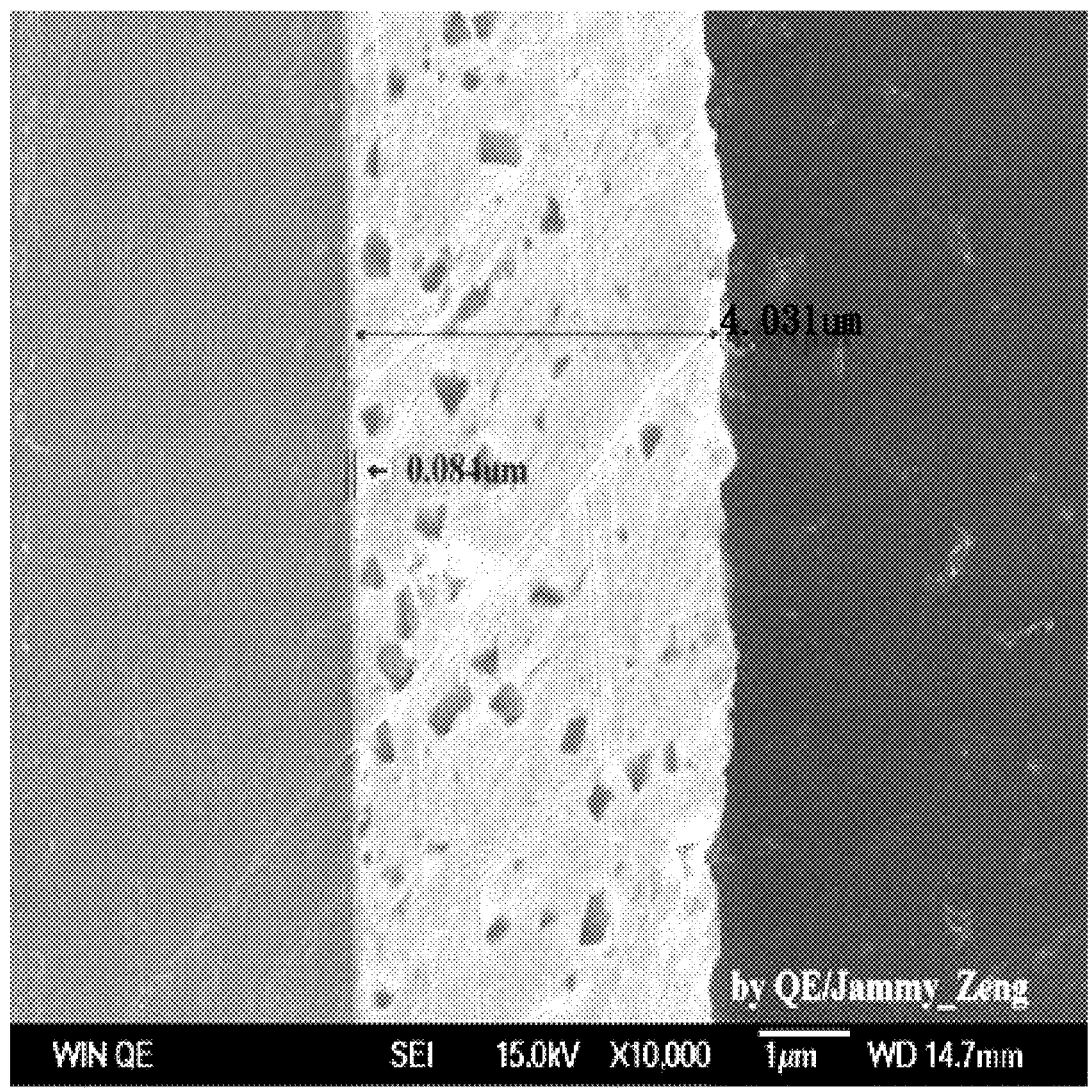
Figure 8C:
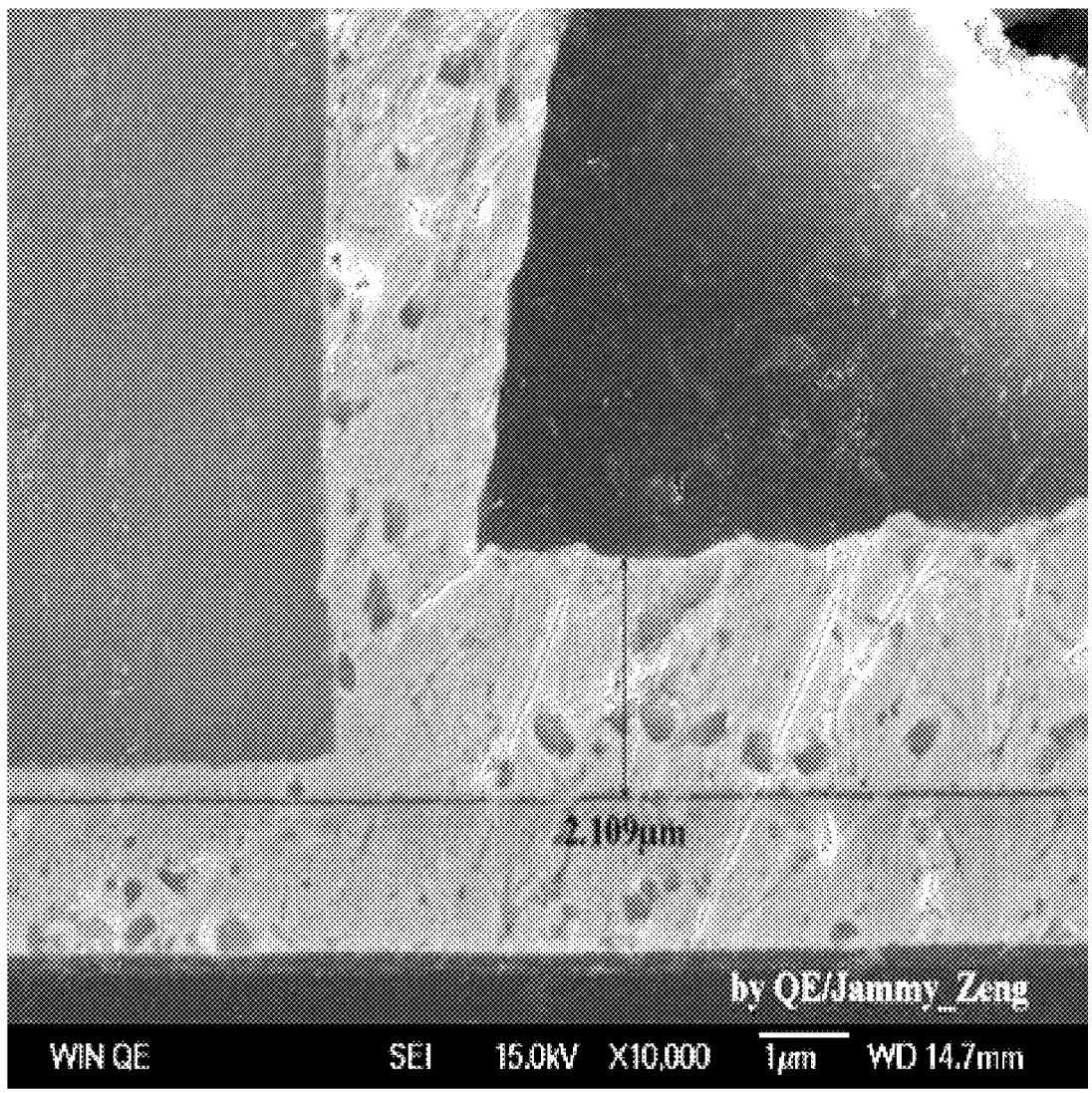
Figure 9:
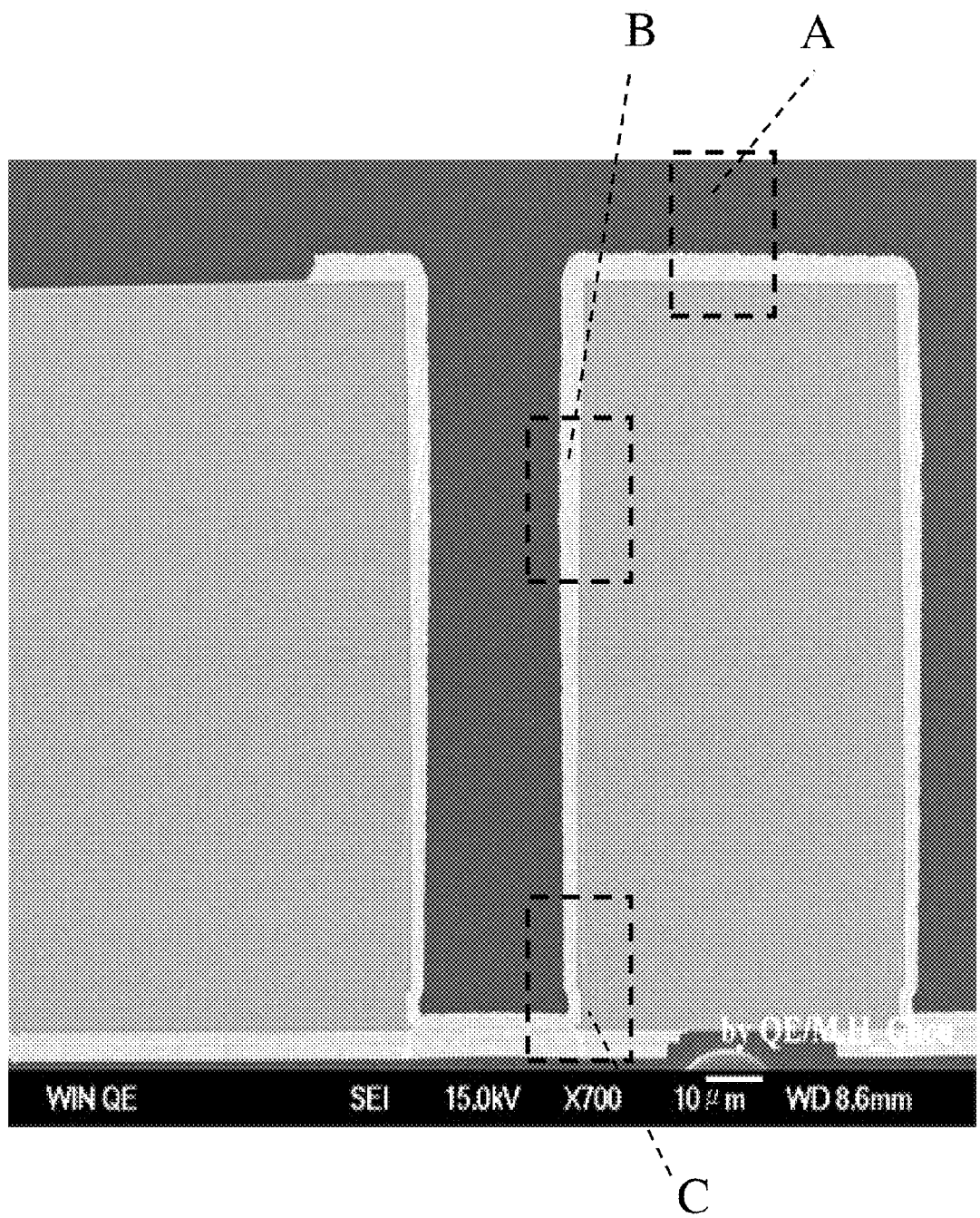
FIG. 9 shows a scanning electron microscopic image of a wafer after electroless plating process, in which intermittent ultrasonic vibrations with a high frequency, multiple streams produced by multiple inlets, and a shaking unit for the wafer holder are applied.

FIGS. 8-9 are scanning electron microscopy (SEM) images of two GaAs wafers with via-holes and metal films plated by different electroless plating conditions FIG. 8 shows the wafer after electroless plating using a single frequency ultrasonic transducer to generate a low frequency vibration and a single inlet to produce a single stream, but without using shaking unit. FIGS. 8A-8C are the enlarged images of the areas A, B, and C in FIG. 8, corresponding to the wafer surface, the inner sidewall of the via-hole, and the bottom of the via-hole, respectively.

Figure 9A:
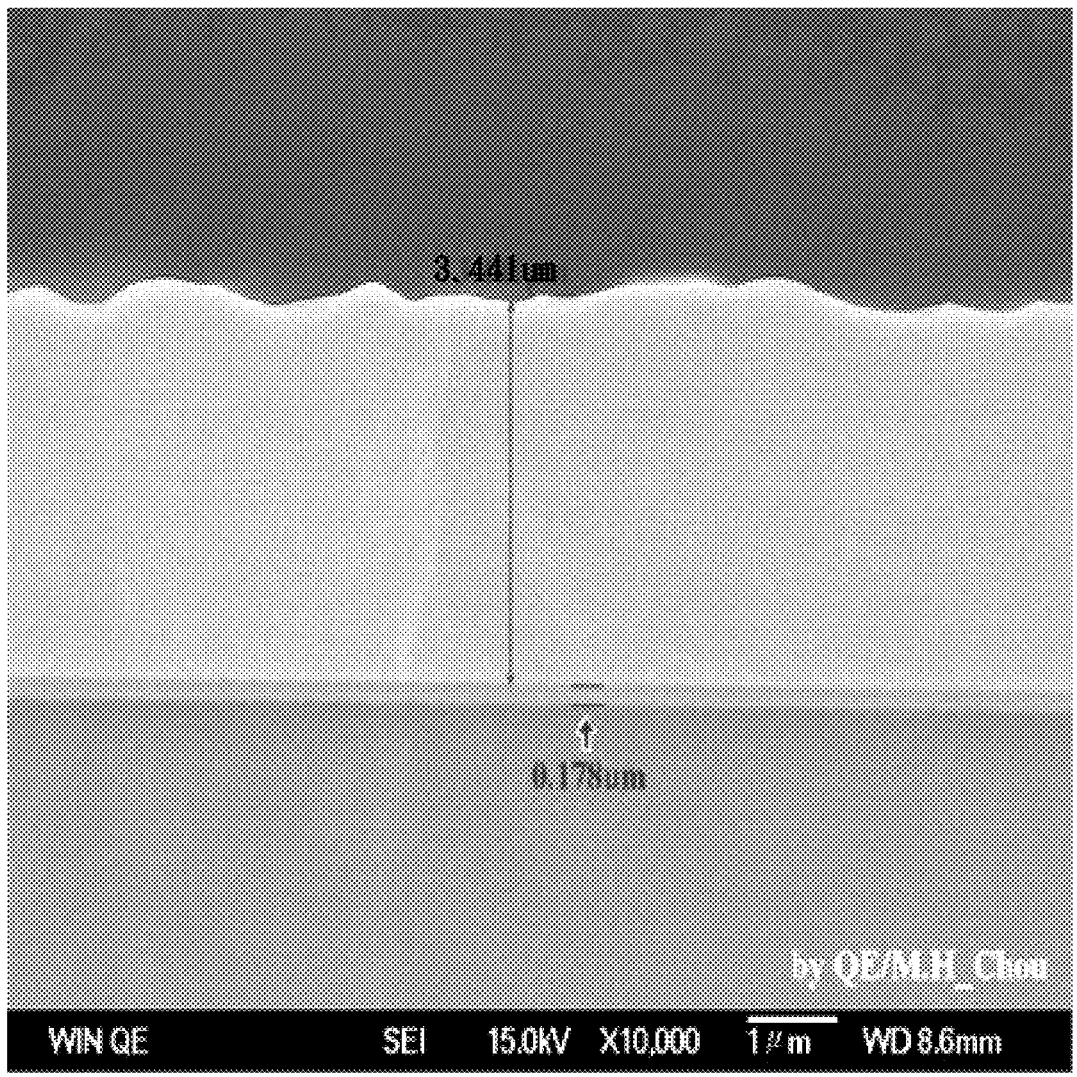
FIGS. 9A-9C show the enlarged areas A, B, and C in FIG. 9.
Figure 9B:
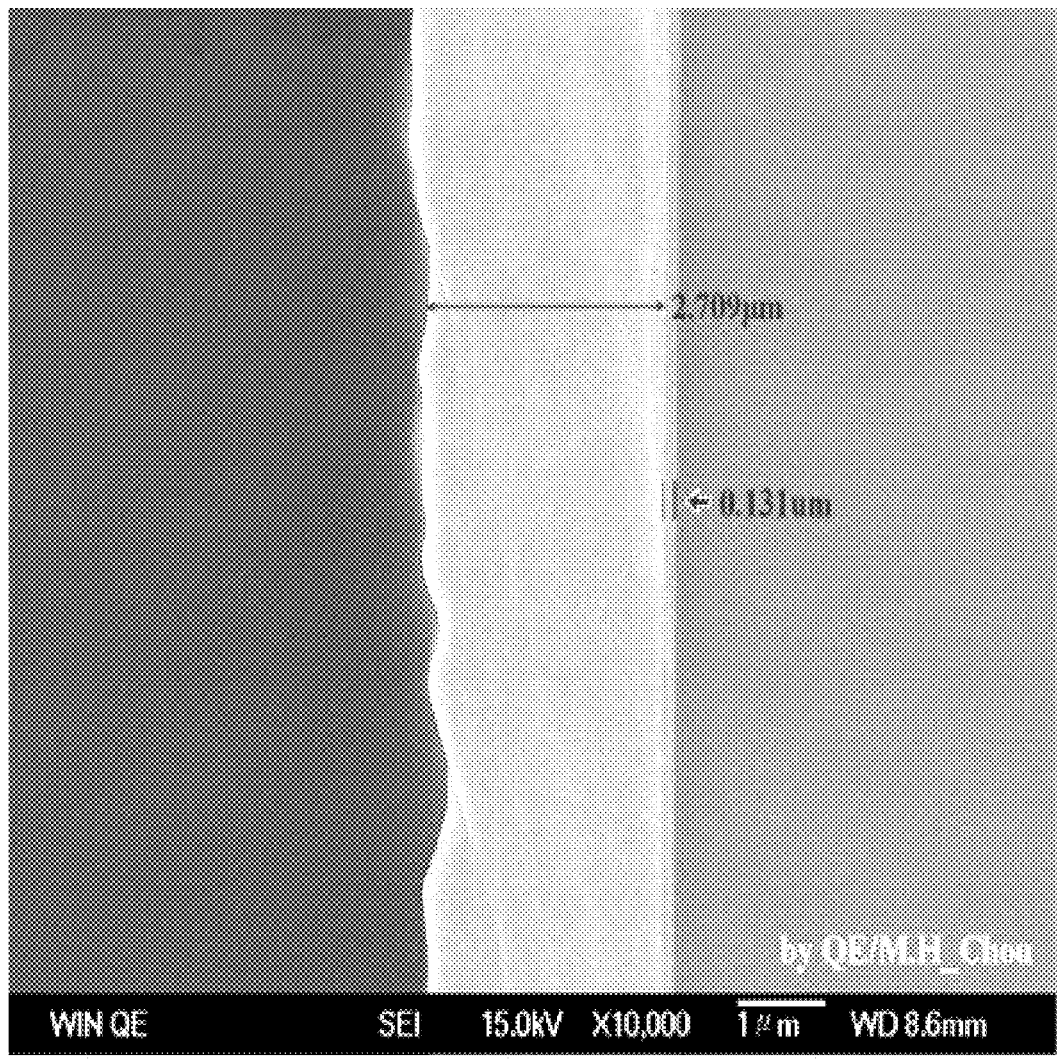
Figure 9C:
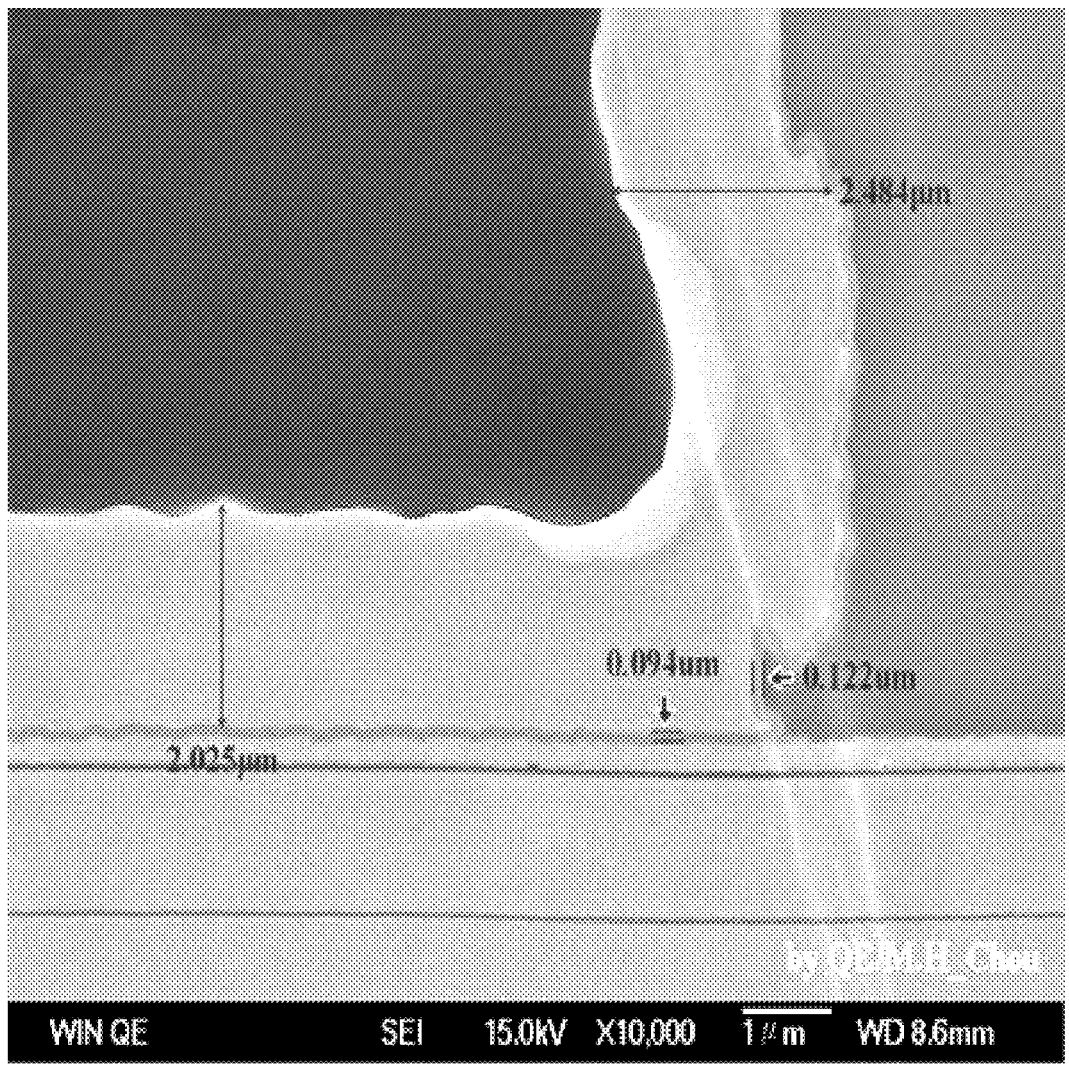

FIG. 9 shows the other wafer after electroless plating using a shaking unit, a plurality of inlets to produce multiple streams, and a plurality of frequency ultrasonic transducers to generate a high-frequency and intermittent vibrations. In FIG. 9, the areas A, B, and C are the wafer surface, the inner sidewall of the via-hole, and the bottom of the via-hole, respectively. The corresponding enlarged images of the area A, B, and C are shown in FIGS. 9A-9C, respectively.

As mentioned above, it is very difficult to plate the inner sidewalls and the bottom surface of a via-hole by the conventional electroless plating process. As shown in FIGS. 8 and 9, it is evident that both the inner side walls and the bottom surface of the via-holes are well plated by using the apparatus and method of the present invention. In particular, as far as the bottom surface of the via-hole is concerned, the plated thickness (more than 800 angstrom) shown in FIG. 9 is twice as thick as that (less than 400 angstrom) shown in FIG. 8. This clearly demonstrates that the apparatus and method of the present invention can improve the plating of via-hole structures, particularly the bottom surface thereof.

Figure 10:
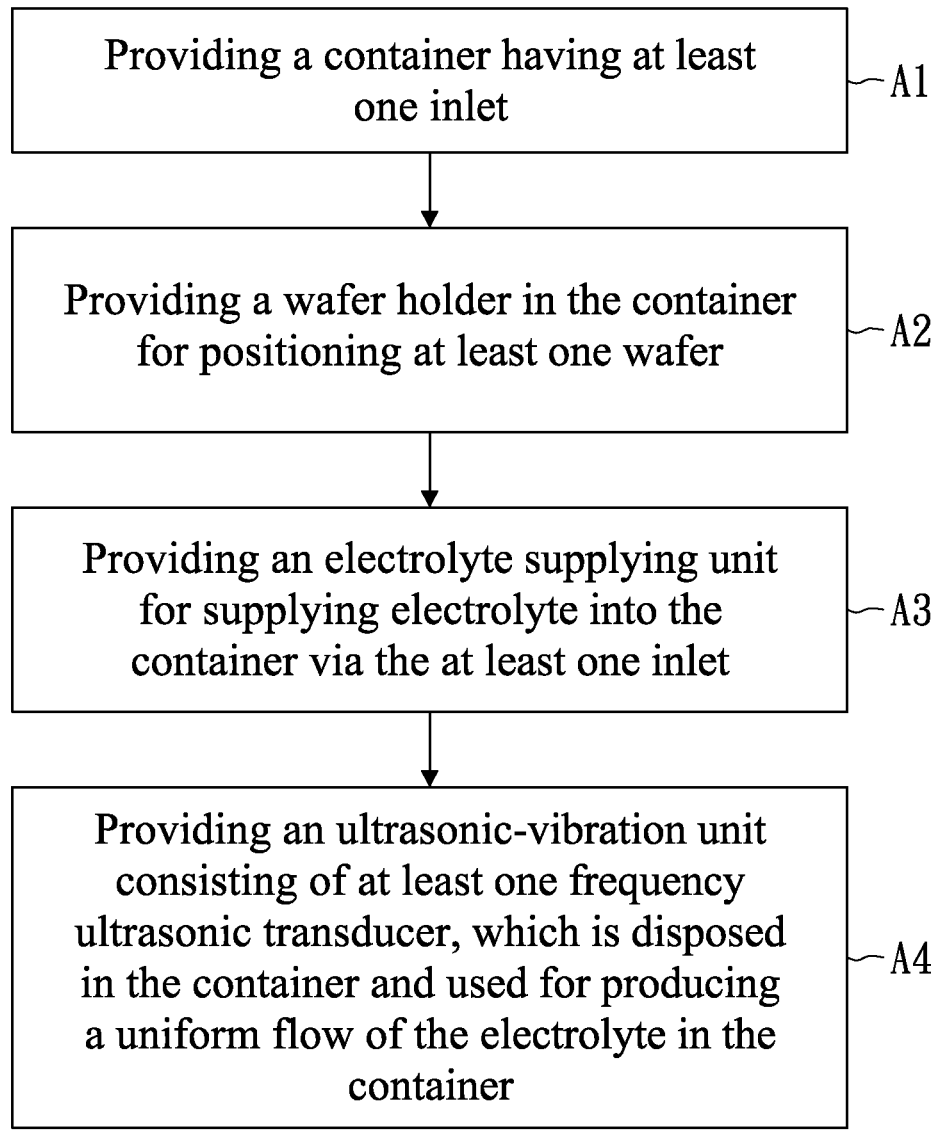
FIG. 10 shows a flowchart of the electroless plating method of the present invention.

Furthermore, as shown in FIG. 10, the present invention also provides an electroless plating method comprising following steps:

Step A1: providing a container having at least one inlet;

Step A2: providing a wafer holder in the container for positioning at least one wafer;

Step A3: providing an electrolyte supplying unit for supplying electrolyte into the container via the at least one inlet; and Step A4: providing an ultrasonic-vibration unit consisting of at least one frequency ultrasonic transducer, which is disposed in the container and used for producing a uniform flow of the electrolyte in the container.

As disclosed in the above description and attached drawings, the present invention provides an electroless plating apparatus and method for semiconductor wafers, by which the electrolyte can be distributed uniformly and flow evenly uniformly around each wafer, and thereby the wafers can be uniformly plated, especially for wafers with fine via holes or trench structures. The apparatus and method disclosed here are new and suitable for mass production.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An electroless plating apparatus, used for plating at least one wafer, comprising:
   a container, used for containing electrolyte and provided with at least an inlet;
   a wafer holder, vertically movably provided within the container, used for holding at least one wafer, so as to fully immerse the at least one wafer vertically in the electrolyte, and the wafer holder comprises a hollow frame and at least one pair of clamps being disposed at the two sides of the hollow frame for holding at least one wafer;
   a shaking unit, connected with the wafer holder for shaking the wafer holder vertically, wherein the shaking unit comprises a driving device, a linking element, and a first connecting element; the driving device is connected with the linking element for moving the linking element vertically; and one side of the first connecting element is connected with the linking element while another side thereof is connected to an upper part of the frame of the wafer holder;
   an electrolyte supplying unit for supplying the electrolyte into the container via the inlet; and
   an ultrasonic-vibration unit, consisting of at least one frequency ultrasonic transducer being disposed in the container and used for producing a uniform flow of electrolyte in the container.

2. The electroless plating apparatus as claimed in claim 1, wherein the container is provided with a plurality of inlets, through which the flow of electrolyte into the container forms multiple streams.

3. The electroless plating apparatus as claimed in claim 1, wherein the electrolyte supplying unit supplies the electrolyte through each inlet into the container by means of a conduit.

4. The electroless plating apparatus as claimed in claim 1, further comprising a circulation unit, wherein the circulation unit is used for receiving electrolyte overflowing out of the container and refilling the overflowing electrolyte into the container via the at least one inlet.

* * * * *